(12) United States Patent
Lim et al.

(10) Patent No.: US 6,214,689 B1
(45) Date of Patent: Apr. 10, 2001

(54) APPARATUS FOR MANUFACTURING SEMICONDUCTOR DEVICE, METHOD OF MANUFACTURING CAPACITOR OF SEMICONDUCTOR DEVICE THEREBY, AND RESULTANT CAPACITOR

(75) Inventors: Jung-kun Lim, Seoul; Jun-sig Park, Kyungki-do, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/258,792

(22) Filed: Mar. 1, 1999

(30) Foreign Application Priority Data

Mar. 2, 1998 (KR) .................................................. 98-6810
Sep. 9, 1998 (KR) .................................................. 98-37196

(51) Int. Cl.$^7$ .................................................. H01L 21/20

(52) U.S. Cl. .................... 438/398; 438/239; 438/255; 438/396

(58) Field of Search .................... 438/238, 253, 438/254, 255, 256, 239, 240, 381, 396, 397, 398, 399

(56) References Cited

U.S. PATENT DOCUMENTS

| | | | |
|---|---|---|---|
| 4,296,372 | * 10/1981 | Feuerbaum .................. | 324/71 |
| 5,757,032 | * 5/1998 | Nishibayashi et al. ........... | 257/77 |
| 5,788,854 | * 8/1998 | Desaigoudar et al. ............ | 216/13 |
| 5,811,819 | * 9/1998 | Ohshima et al. ................ | 250/423 |
| 6,017,630 | * 1/2000 | Tanaka et al. ................. | 428/402 |

OTHER PUBLICATIONS

P.C> Fazan, et al. "A High–C Capacitor with Ultrathin CVD Tantalum Oxide Films . . . ", 1992 IEEE IEDm, p. 263.*
H. Watanabe, "HSG Si Formation on in–situ Phosphorus Doped a–Si Electrode . . . ", IEE Trans, on Elec. Dev., vol. 42, No. 7, p. 1247.*
K. Suzuki et al., "HSG LPCVD Polysilicon Films for Use in MEMS Applications", IEEE Transducers '97, p. 253.*

* cited by examiner

*Primary Examiner*—John F. Niebling
*Assistant Examiner*—Viktor Simkovic
(74) *Attorney, Agent, or Firm*—Jones Volentine, L.L.C.

(57) ABSTRACT

An apparatus for manufacturing a semiconductor device and a method of manufacturing a capacitor of a semiconductor device prevents the decrease of the surface area of a hemispherical grained (HSG) film formed on a lower electrode of the capacitor of the semiconductor device due to the abrasion of the HSG film during a subsequent cleaning process. The method of manufacturing a capacitor includes: forming a lower electrode of a capacitor of a semiconductor device over a specific structure formed on a semiconductor substrate; forming a hemispherical grained (HSG) film on an exposed surface of the lower electrode; stabilizing the HSG film in order to prevent the decrease of the surface area of the HSG film due to the abrasion of the HSG film during subsequent cleaning. The apparatus for manufacturing a semiconductor device includes a first process chamber for formation of the HSG film on a lower electrode of a capacitor of the semiconductor device and a second process chamber which stabilizes the HSG film. The resultant capacitor includes a lower electrode formed over a semiconductor substrate, a stabilized HSG film over the lower electrode, a dielectric layer over the stabilized HSG film, and an upper electrode over the dielectric layer.

6 Claims, 8 Drawing Sheets

APPARATUS FOR MANUFACTURING SEMICONDUCTOR DEVICE, METHOD OF MANUFACTURING CAPACITOR OF SEMICONDUCTOR DEVICE THEREBY, AND RESULTANT CAPACITOR

CROSS-REFERENCES TO RELATED APPLICATIONS

The present application claims priority under 35 U.S.C. §119 to Korean Patent Application No. 98-6810 filed on Mar. 2, 1998 and to Korean Patent Application No. 98-37196 filed on Sep. 9, 1998, the entire contents of both of which are hereby incorporated in their entirety by reference.

BACKGROUND OF THE INVENTION

1. Field of the Invention

The present invention relates to an apparatus for manufacturing a semiconductor device, a method of manufacturing a capacitor of a semiconductor device thereby, and a resultant capacitor. More particularly, the present invention is directed to an apparatus for manufacturing a semiconductor device for stabilizing a hemispherical grained (HSG) film formed over the semiconductor substrate in order to increase the capacitance of the capacitor so as to prevent the abrasion of the HSG film due to the cleaning for the HSG film after its formation, a method of manufacturing a capacitor of a semiconductor device thereby, and a resultant capacitor having a stabilized HSG film.

2. Description of the Related Art

Since semiconductor memory devices are becoming more highly integrated, and the sophistication and capacity of the devices increase, there are ongoing efforts to keep the devices as small as possible for subsequent implementation in miniature electronic products while satisfying the demand for the increase of the capacitance of the device. In view of this desire to obtain smaller devices and greater capacitance thereof, the space of each memory cell must be reduced accordingly.

Generally, each memory cell unit of a DRAM (Dynamic Random Access Memory) is composed of a transistor and a capacitor. Even with the reduced cell size as described above, the memory device must still have a sufficient minimum threshold capacitance in order to function properly. A semiconductor capacitor includes a lower electrode (storage electrode) and an upper electrode (plate electrode), with a dielectric material between the two electrodes.

There are several types of capacitors produced to increase the capacitance thereof as high as possible. An example of such a capacitor is a trench capacitor, which is made by cutting deeply into a semiconductor substrate. Another example is a stack capacitor, which obtains sufficient capacitance by making the structure of the capacitor complicated, i.e., fin-shaped or cylinder-shaped, so as to increase the surface area rather than by forming a deposition structure, which may result in a high step-height.

The memory capacitance of the DRAM device generally depends on the lower or storage electrode of the capacitor. Therefore, various methods have been proposed to increase the capacitance of highly-integrated semiconductor devices including the formation process of its lower electrode, and the following processes. For example, a dielectric material, such as TiN and $Ta_2O_3$, etc., with a high permittivity maybe deposited after etching a polysilicon film of the lower electrode. Alternatively, the surface area of the capacitor may be increased by changing the manner of etching a polysilicon film of the lower electrode.

However, the increasing of the surface area of the capacitor is achieved using the properties of the material of the lower electrode itself rather than by improving the dielectric film or by altering the structure of the lower electrode, as described above. Such an increase of the surface area of the capacitor may include forming polycrystalline hemispherical grained (hereinafter referred to as HSG) with a roughened surface on the exposed surface of the lower electrode. One grain of the HSG is 500 to 1000 Å, and can double the capacitance of the normal capacitor.

FIG. 1 shows conventional process sequences of the method of manufacturing a capacitor of a semiconductor device. As shown in FIG. 1, after forming contact holes on a specific structure being composed of a nitride film or an oxide film on a semiconductor substrate, and depositing amorphous silicon film, a photo-etch process is carried out so as to form at step S2 a desired pattern of the lower electrode of the capacitor of the semiconductor device. The lower electrode contacts the source area of the transistor through contact holes, and stores information according to the charges transferred from the source area. The oxide film formed on the semiconductor substrate is an intermediate insulating layer.

Then, a HSG film is formed on the lower electrode by step S4, wherein a surface of the lower electrode composed of the silicon is formed as hemispherical-shape, its surface energy being stabilized at a temperature of the phase transition of the amorphous silicon (a-Si) and the polycrystalline silicon by the migration of the silicon.

The HSG film is formed by conventional chemical vapor deposition (CVD), for example, low pressure chemical vapor deposition (LPCVD). That is, after maintaining a process chamber at a temperature of 550° C., a silicon-containing gas, e.g., $Si_2H_6$ or $SiH_4$ having a high surface reactivity is injected into the process chamber so as to form a nucleus on the surface of the lower electrode. By applying a thermal treatment thereon, the surface is roughened and a hemispherical-shaped HSG is formed by the thermal migration of the nucleus. In addition, the HSG formed as described above is turned into polysilicon by the diffusion of the phosphorus after forming the HSG. As a result, the HSG has a surface area two or three times that of a flat surface over the same region.

FIG. 2 is a SEM image showing the surface state of the HSG formed on the surface of the lower electrode after step S4. As shown in FIG. 2, hemispherical grain is well-formed on the surface of the lower electrode.

Then, the semiconductor substrate having the HSG formed thereon is cleaned by a step S6, to remove a native oxide film formed during the above process. The native oxide film has a low permittivity, thus greatly decreasing the capacitance of the capacitor, and causing a malfunction during the subsequent formation of the dielectric film. The removal of the native oxide film is carried out using Standard Chemical-1 (SC-1) cleaning solution by means of a wet-etch process.

FIG. 3 is a SEM image of the HSG after cleaning the HSG of the FIG. 2 using SC-1 for 10 minutes. The surface area of the HSG shown in FIG. 3 is sharply reduced because the hemispherical-shaped protrusion thereof is significantly removed compared with the state of the HSG shown in FIG. 2. The surface area of the HSG shown in FIG. 3 is reduced by 50% compared with the surface area shown in FIG. 2.

The reduction of the surface area of the HSG is proportional to the cleaning time. However, if the cleaning time is reduced, the contaminants on the surface of the HSG, i.e., the non-uniform native oxide film, etc. are not completely removed. Failure to completely remove the contaminants affects the uniformity of the dielectric layer to be deposited later and/or increases the resistance and the stress between layers, thereby generating a leakage current.

Then, a dielectric film is formed by a step S8, wherein a nitride-oxide film (NO film) is deposited on the HSG having passed through the cleaning process.

Then, an upper electrode is formed by a step S10, wherein polysilicon, which serves as the upper electrode, is deposited on the dielectric film.

The conventional method of manufacturing a capacitor has a serious problem as described above. That is, as illustrated in FIGS. 2 and 3, showing the SEM image of the surface of the HSG after the deposition and after the cleaning, respectively, the surface of the HSG is significantly worn by the cleaning, thereby reducing the surface area.

The hemispherical shape is formed during the formation of the HSG film because of the migration of the silicon. The amorphous silicon is turned into crystalline silicon. However, the resultant crystalline structure has a short-range order rather than a long-range order. As a consequence of this unstable crystalline structure, the surface of the HSG is worn down during the cleaning process for the removal of a native oxide film by a cleaning solution, for example, a Standard Chemical-1 (SC-1).

Therefore, the decrease of the surface area of the HSG due to the abrasion of the HSG results in the decrease of the capacitance of the capacitor, which is contrary to the desired demand for the sufficient capacitance while reducing the size of the capacitor.

SUMMARY OF THE INVENTION

The present invention is directed to provide a method of manufacturing a capacitor of a semiconductor device for preventing the decrease of the surface area of a HSG film formed over a semiconductor substrate during the cleaning for the HSG film by stabilizing the HSG film before carrying out the cleaning, which substantially obviates one or more of the problems due to the limitation and the disadvantages of the related art.

Another objective of the present invention is to provide an apparatus for manufacturing a semiconductor device for stabilizing the layer properties of the HSG film in order to prevent the decrease of the surface area of the HSG film during the cleaning therefor.

Another objective of the present invention is to provide a capacitor for a semiconductor device which has sufficient capacitance and reduced size.

To achieve at least one of these and other advantages and in accordance with the purpose of the present invention as embodied and broadly described, the method of manufacturing a capacitor of a semiconductor device includes: forming a lower electrode of a capacitor of a semiconductor device over a specific structure formed on a semiconductor substrate; forming a hemispherical grained (HSG) film on an exposed surface of the lower electrode; and stabilizing the HSG film prior to subsequent processing to form a stabilized HSG film. The subsequent processing may include cleaning the stabilized HSG film.

The stabilizing of the HSG film may include performing an Electron Charge-up on the surface of the HSG film. The Electron Charge-up for the surface of the HSG film may be performed using a Scanning Electron Microscope (SEM) equipment for 5 to 20 minutes with 1000 to 1500 V of acceleration voltage, and 8 to 12 A of filament current.

The stabilizing of the HSG film may include performing a thermal treatment on the HSG film at a higher temperature than a process temperature for the formation of the HSG film. Or, the stabilizing of the HSG film may be performed by irradiating the HSG film with a laser, or a maser. Alternatively, the stabilizing of the HSG film can be carried out by implanting specific impurities into the HSG film.

In another aspect of the present invention, the apparatus for manufacturing a semiconductor device comprises a process chamber for carrying out the formation of a HSG film on a lower electrode of a capacitor of a semiconductor device, and an Electron Charge-up unit is installed in the process chamber for charging up the HSG film by injecting electrons into the HSG film in order to stabilize the HSG film after completing the formation of the HSG film.

The Electron Charge-up unit includes: an electron gun for generating electrons; an electron optical element which collects the electrons generated from the electron gun; and a deflection coil, installed beneath the electron optical element, which controls the direction of the electrons collected by the electron optical element.

In another aspect of the present invention, the apparatus for manufacturing a semiconductor device includes: a first process chamber for carrying out the formation of a HSG film on a lower electrode of a capacitor of a semiconductor device; a load lock chamber being connected to the first process chamber with a vacuum state; and a second process chamber being connected to the load lock chamber and comprising an Electron Charge-up unit for charging up the HSG film by injecting electrons into the HSG film in order to stabilize the HSG film.

In another aspect of the present invention, the apparatus for manufacturing a semiconductor device includes: a first process chamber for carrying out the formation of a HSG film on a lower electrode of a capacitor of a semiconductor device; a load lock chamber being connected to the first process chamber with a vacuum state; and a thermal process chamber being connected to the load lock chamber for performing thermal treatment on the HSG film at a higher temperature than the formation of the HSG film in order to stabilize the HSG film.

In another aspect of the present invention, a capacitor for a semiconductor device includes a lower electrode formed over a semiconductor substrate, a stabilized HSG film over the lower electrode, a dielectric layer over the stabilized HSG film, and an upper electrode over the dielectric layer.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

According to the present invention, an apparatus for manufacturing a capacitor of a semiconductor device, a method thereof, and a resultant capacitor are provided for preventing the decrease of the capacitance of a capacitor due to the removal of a hemispherical grained (HSG) film formed in order to increase the surface area of the capacitor during the subsequent processing thereof, e.g., cleaning.

Originally, a technique of forming the HSG film on a lower electrode of the capacitor is disclosed in H. Watanabe et al., "Hemispherical Grained Silicon Formation on In-Situ Phosphorous Amorphous-Si Using The Seeding Method", SSDM'92 pp. 422–424. The HSG film increases the surface area of the capacitor by relying on the fact that a hemisphere-shaped area is formed at the transition temperature ranges of crystalline-Si and amorphous-Si by silicon migration, with its surface energy being stable. The HSG film forming method also relies on the fact that silicon gas groups, such as $Si_2H_6$ and $SiH_4$, have a high surface reactivity, and that part of the silicon particles of the lower electrode form protrusions that serve as a seed for hemispherical grain during the CVD process, making the wafer surface rough. This roughened surface increases the effective surface area of the electrode which thereby increases the capacitance of the capacitor.

However, even though amorphous-Si has been transformed by conventional techniques into crystalline-Si, the resultant crystal structure may have just a short-range order, not a long-range order, i.e., the state of the resultant hemispherical crystalline structure is unstable. Therefore, the protrusions of the HSG film may be removed during subsequent cleaning the HSG film by cleaning chemicals, for example, SC-1 cleaning solution.

Accordingly, the present invention provides a technique to stabilize the HSG film by supplying a specific energy on the surface of the HSG film with an unstable crystalline structure using an Electron Charge-up, or a thermal treatment, an irradiation with a laser or a maser, an implantation of impurities, etc.

Figure 1:
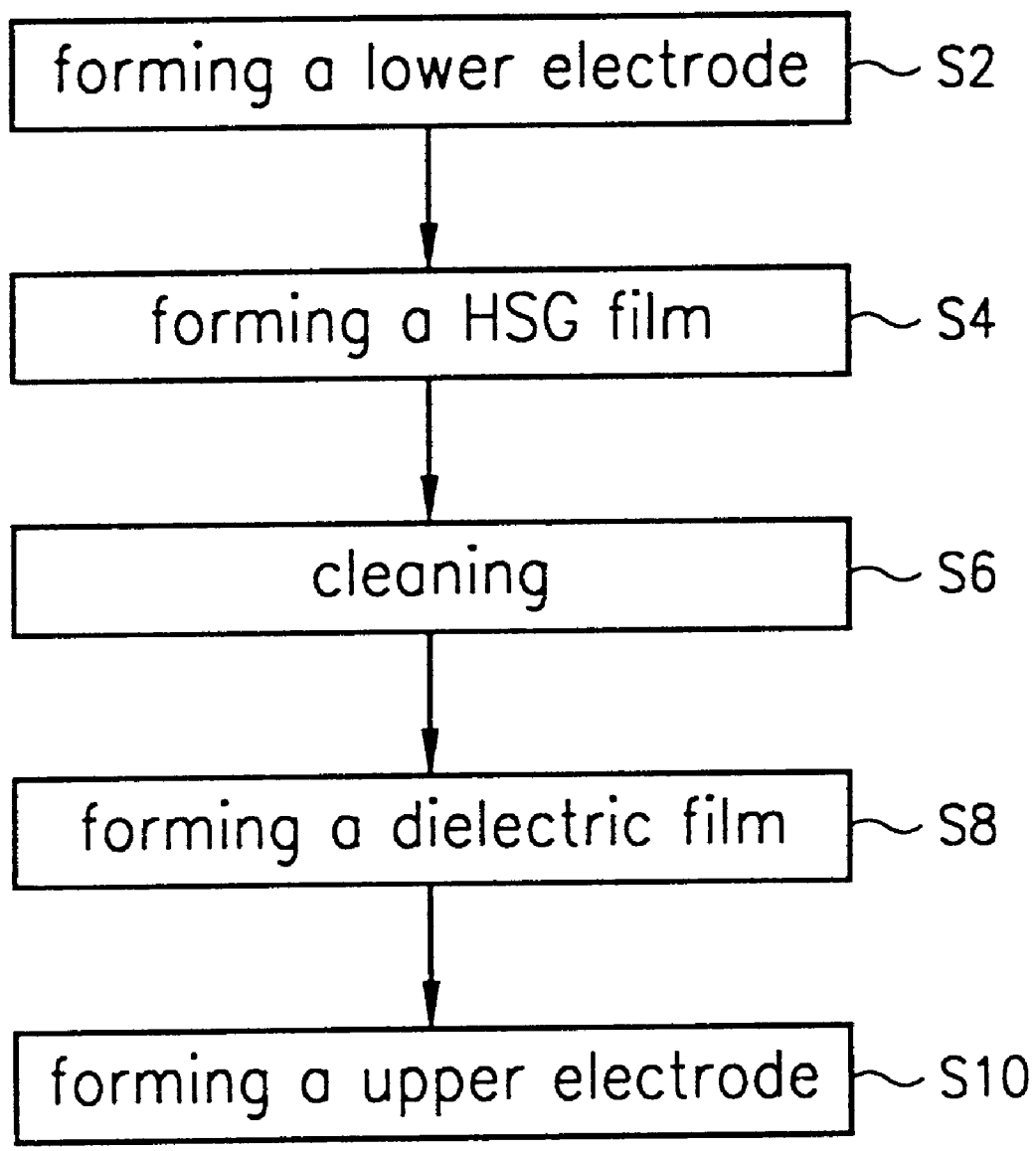
FIG. 1 is a conventional process sequence of the method of manufacturing a capacitor of a semiconductor device.
Figure 2:
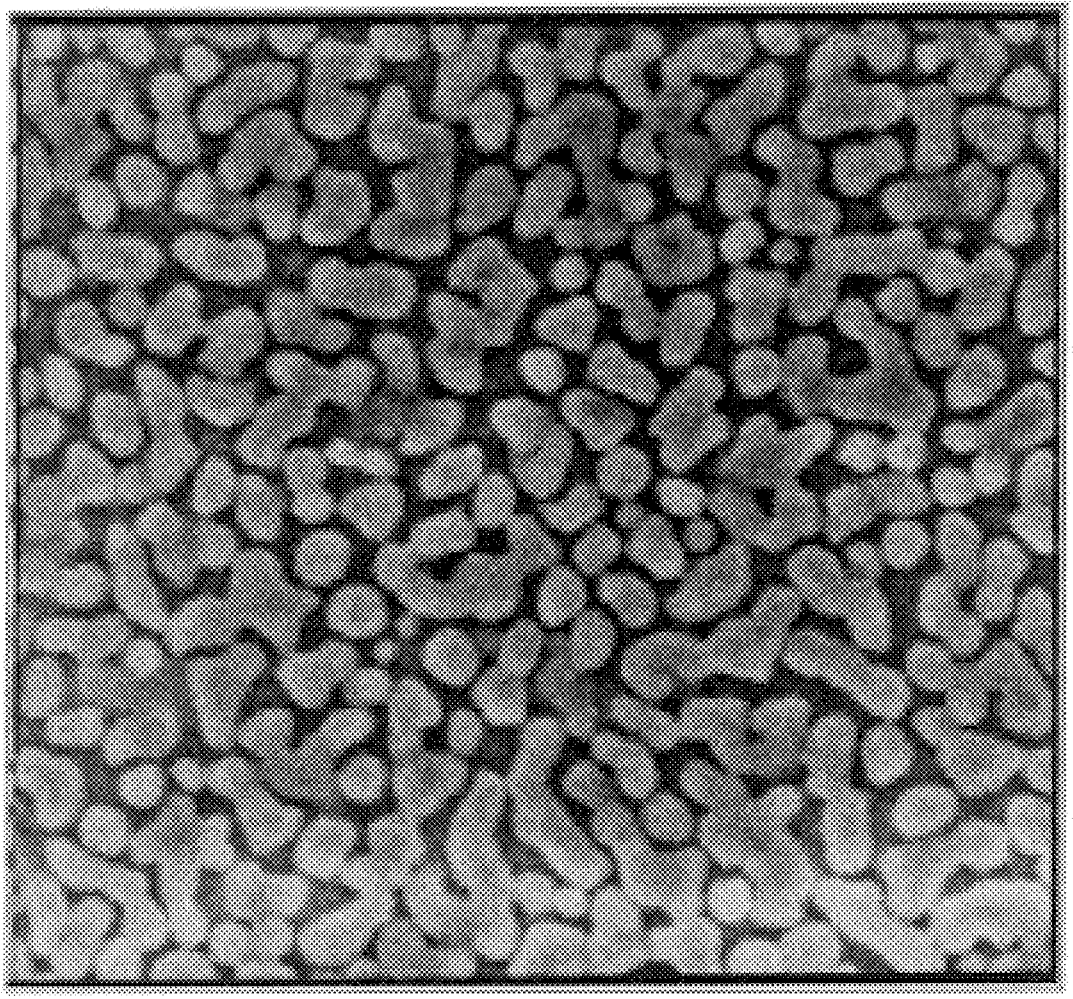
FIG. 2 is a conventional SEM image showing the surface state of the HSG film formed on the surface of a lower electrode.
Figure 3:
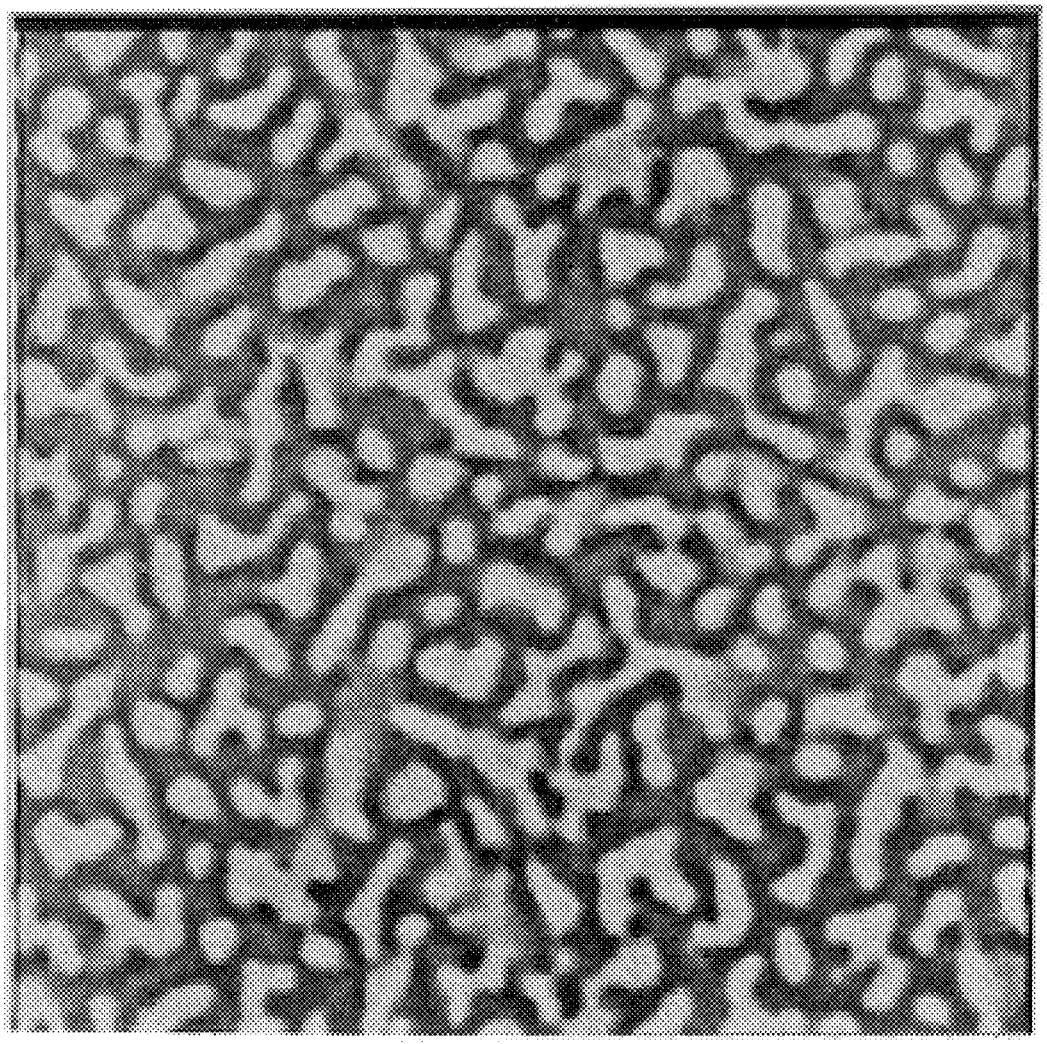
FIG. 3 is a conventional SEM image of the HSG film formed on a lower electrode by the conventional method after cleaning the HSG film using a Standard Chemical-1 (SC-1) cleaning solution.
Figure 4:
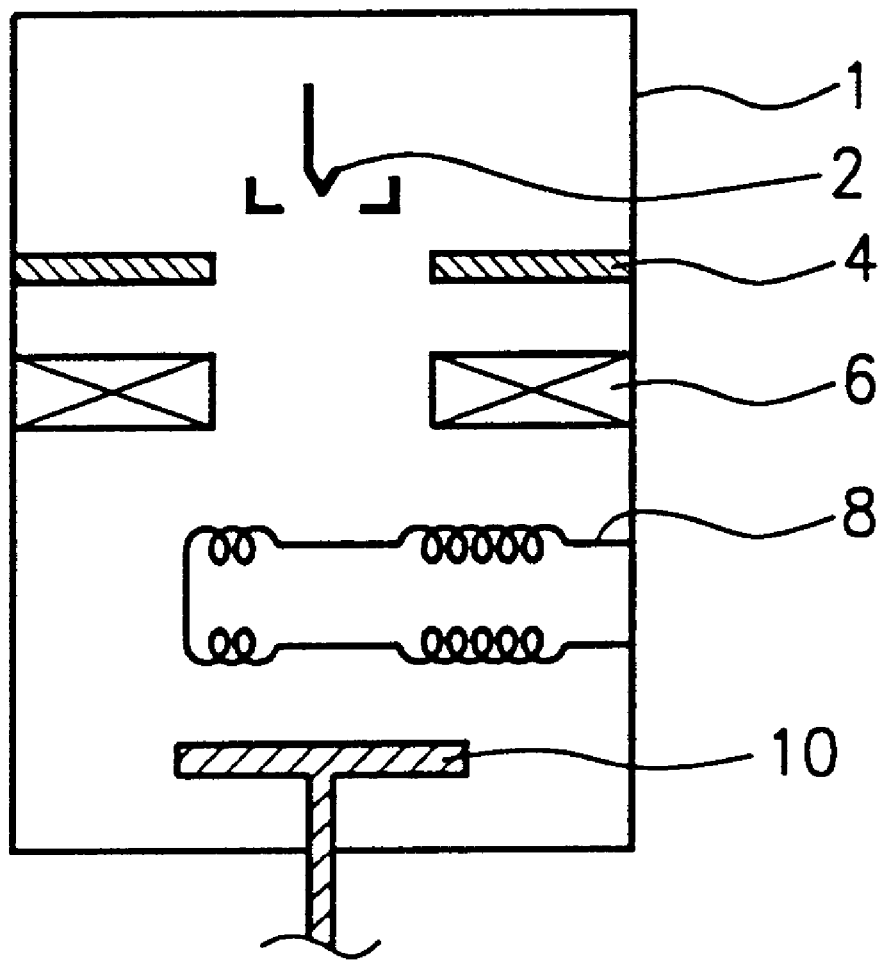
FIG. 4 is a schematic representation showing a process chamber including an electron emission device according to one embodiment of the present invention.

FIG. 4 shows an apparatus for manufacturing semiconductor devices according to an embodiment of the present invention. In detail, FIG. 4 is a schematic view showing a process chamber including an electron emitter for performing the Electron Charge-up on the surface of the HSG film. The electron emitter basically has a structure similar to a Scanning Electron Microscope (SEM) equipment, or the SEM itself can be used.

As shown in FIG. 4, a process chamber 1 includes: an electron gun 2 disposed on the upper side inside the process chamber 1 for generating electrons; an anode 4 for accelerating the ejected electrons; an electron optical element 6 for determining the size of the spot area of the electrons incident on the semiconductor substrate after being accelerated by the anode 4; a deflection coil 8 for determining the direction of the electrons incident on the semiconductor substrate; and a chuck 10 for mounting the semiconductor substrate thereon.

The process chamber 1 including the electron emitter may be a normal process chamber capable of carrying out a Low Pressure Chemical Vapored Deposition (LPCVD) process for the formation of the HSG film. However, the process chamber 1 including the electron emitter can be used as an independent piece of equipment for manufacturing semiconductor devices, unlike the conventional process chamber previously employed for the formation of the HSG film. The process chamber 1 including the electron emitter can also be connected to the conventional process chamber of a LPCVD equipment capable of forming the HSG film through the load lock chamber.

Meanwhile, even when performing a thermal treatment for the surface of the HSG film, irradiating it with laser, or maser (microwave amplification by stimulated emission of radiation), or implanting impurities into the surface of the HSG film in order to stabilize the HSG film, the process chamber used in the formation of the HSG film can be installed in the same manner as above. That is, a process chamber for formation of the HSG film can still be used, or an another process chamber can be employed.

Figure 5:
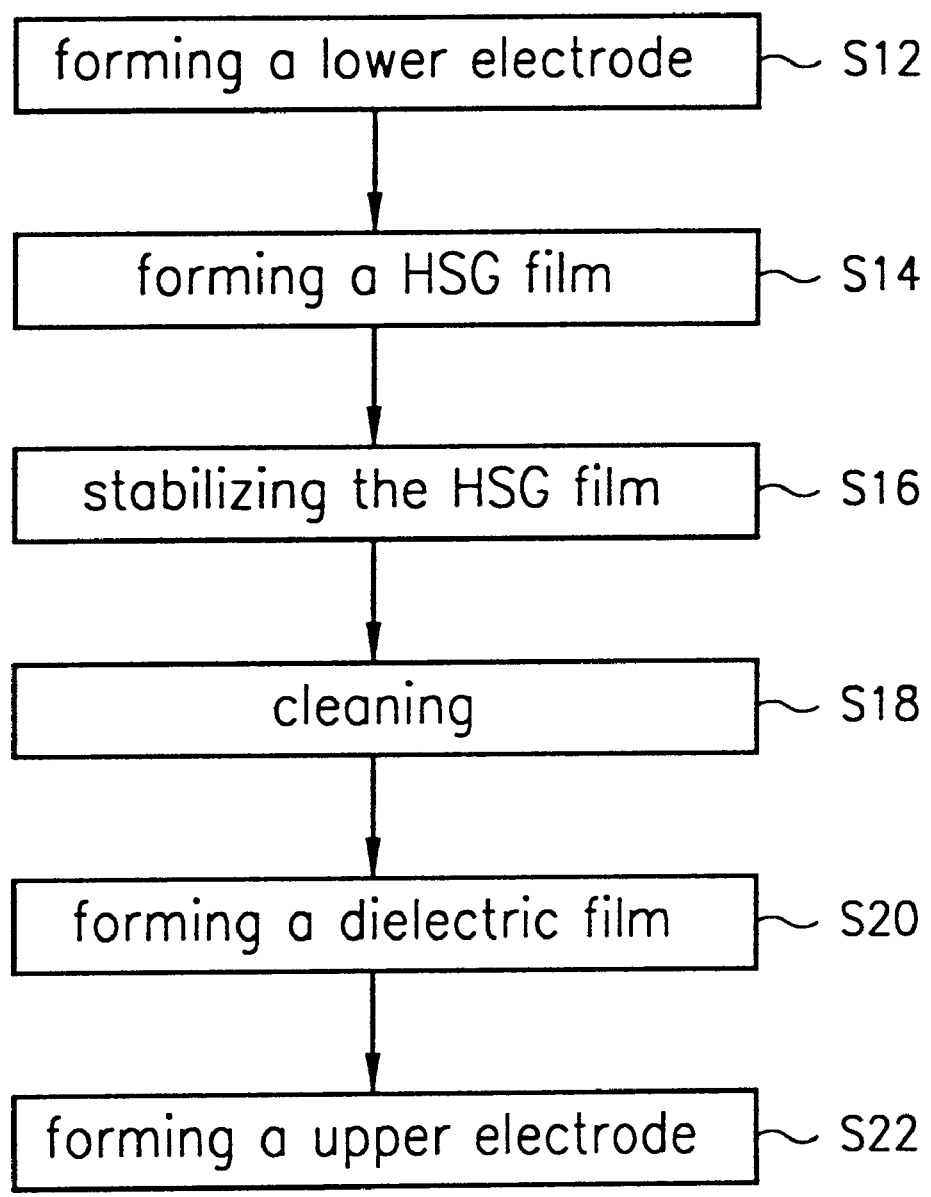
FIG. 5 is a process sequence of the method of manufacturing a capacitor of a semiconductor device according to an embodiment of the present invention.

Now, referring to FIG. 5, the method of manufacturing a capacitor of a semiconductor device according to one embodiment of the present invention will be described in detail.

A lower electrode of a capacitor of a semiconductor device is formed over a specific structure including an oxide film or a nitride film formed on a semiconductor substrate (S12). That is, contact holes are formed on the specific structure on the semiconductor substrate, amorphous silicon is deposited throughout the surface of the semiconductor substrate including the contact holes, and a lower electrode pattern is formed by carrying out a conventional photolithography process and a conventional etch process.

Then, a HSG film is formed on the exposed surface of the lower electrode (S14), and for the LPCVD process, model ANELVA SRE-2100 may be used. As described above, the formation of the HSG film relies on the fact that a hemisphere-shaped area is formed at the transition temperature ranges of crystalline-Si and amorphous-Si by silicon migration, with its surface energy being stable, which is carried out by supplying silicon gas groups, such as $Si_2H_6$ and $SiH_4$, having a high surface reactivity into the process chamber, and the HSG film is formed at a temperature range between 550° C. to 640° C.

Then, the HSG film is stabilized (S16), to prevent the HSG film from being worn down during subsequent cleaning. Various methods can be employed in order to stabilize the HSG film as described above, that is, performing an Electron Charge-up, performing a thermal treatment, irradiating with a laser or a maser, or injecting a certain level of impurities.

Then, the HSG film is subjected to subsequent processing, e.g., cleaning (S18) which is performed before the formation of a dielectric film in order to remove a native oxide film formed on the HSG film and/or to remove contaminants. The native oxide film has a low permittivity thereby greatly decreasing the capacitance of the capacitor. The native oxide film can be removed by a wet etch process using a Standard Chemical-1 cleaning solution. The process time is approximately 10 minutes.

Then, a dielectric film is formed (S20), which may include depositing a nitride-oxide (NO) film on the HSG film after the cleaning.

Then, an upper electrode is formed (S22), which may include depositing a polysilicon on the dielectric film, and an upper electrode is formed using a conventional photo-etch process so as to provide a desired pattern thereby completing the capacitor of the semiconductor device.

FIGS. 6 to 9 are cross-sectional views illustrating phases of manufacturing a capacitor of a semiconductor device according to an embodiment of the present invention.

Figure 6:
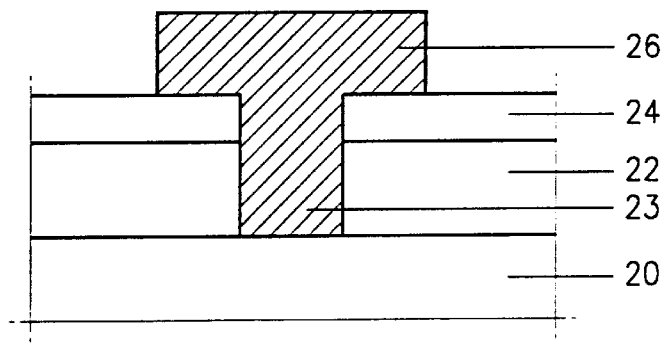
FIGS. 6 to 9 are cross-sectional views illustrating steps of manufacturing a capacitor of a semiconductor device according to an embodiment of the present invention.

FIG. 6 is a cross-sectional view showing that a lower electrode 26 is formed over a semiconductor substrate 20 having a specific structure including a nitride film 22, etc. to insulate a certain conductive layer pattern (not seen), and an oxide film 24 thereon.

The lower electrode 26 is electrically coupled with a source of a transistor through contact holes 23. The lower electrode 26 can be used to store a bit of information wherein the access transistor allows data to be written to or read from the capacitor. The oxide film 24 serves as an intermediate insulating layer. That is, the oxide film 24 serving as the intermediate insulating layer is formed over the specific structure formed on the semiconductor substrate 20, and then, contact holes 23 are formed for the electrical communication of the lower electrode 26 and the semiconductor substrate 20. Next, amorphous silicon for the lower electrode 26 is formed throughout the semiconductor substrate including the contact holes 23 using LPCVD, and the lower electrode 26 is formed by photo-etch process. The types and the structure of the lower electrode 26 can vary without departing from the spirit of the present invention.

Figure 7:
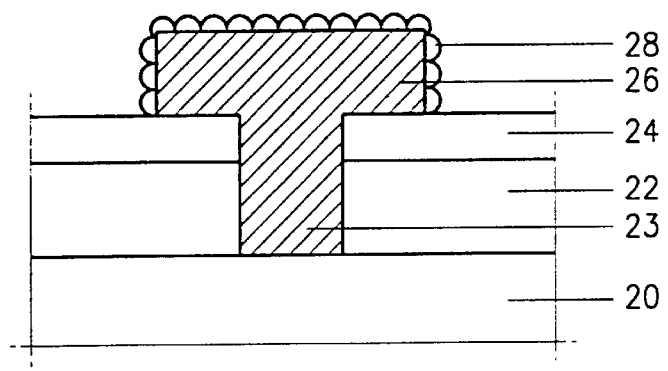

FIG. 7 is a cross-sectional view showing that the HSG film 28 is formed on the lower electrode 26. The formation of the HSG film relies on the fact that a hemisphere-shaped area is formed at the transition temperature ranges of crystalline-Si and amorphous-Si by silicon migration, with its surface energy being stable. The HSG silicon film 28 increases the surface area of the capacitor by two or three times as much as that a flat surface over the same region.

The HSG film 28 may be formed by LPCVD. That is, a process chamber maintains a constant temperature, for example 550° C., between 550° C. and 640° C. with 1 Torr of pressure. In a subsequent seeding, a seeding gas including molecules of $Si_2H_6$ and $SiH_4$ are irradiated on the surface of the exposed lower electrode 26, with the molecules exhibiting active surface reactions. Next, thermal treatment is carried out to form the HSG film 28. The surface of the HSG film 28 is thus characterized by concave and convex hemispherical shapes due to the thermal migration of silicon particles. In addition, impurities such as B phosphorus can be diffused during the formation of the HSG film 28. Next, the HSG film 28 formed on the semiconductor substrate is stabilized such that the abrasion of the HSG film 28 is prevented during subsequent processing, e.g., cleaning, of the semiconductor substrate 20.

In order to stabilize the HSG film 28, the semiconductor substrate is moved to a SEM equipment and an Electron Charge-up is performed on the HSG film 28. When using a process chamber having an electron emitter therein, right after forming the HSG film, the surface of the HSG film can be irradiated with electrons so as to perform the Electron Charge-up.

An example of process conditions inside the process chamber having the SEM equipment as shown in FIG. 4 is as follows. The acceleration voltage of the electrons generated from the SEM equipment is 1000 to 1500 V, the filament current is 8 to 12 A, and a process time is 5 to 20 minutes. Preferably, the Electron Charge-up is performed with acceleration voltage of less than 1300 V and the current of less than 10 A.

The native oxide film (not seen) formed on the surface of the HSG film 28 is removed by wet-etch using the SC-1 cleaning solution. The native oxide film adversely affects on the increase of the capacitance of the capacitor. That is, the native oxide film has a low permittivity, thereby decreasing the capacitance of the capacitor and causing a malfunction during the deposition of the dielectric film 30.

Figure 10:
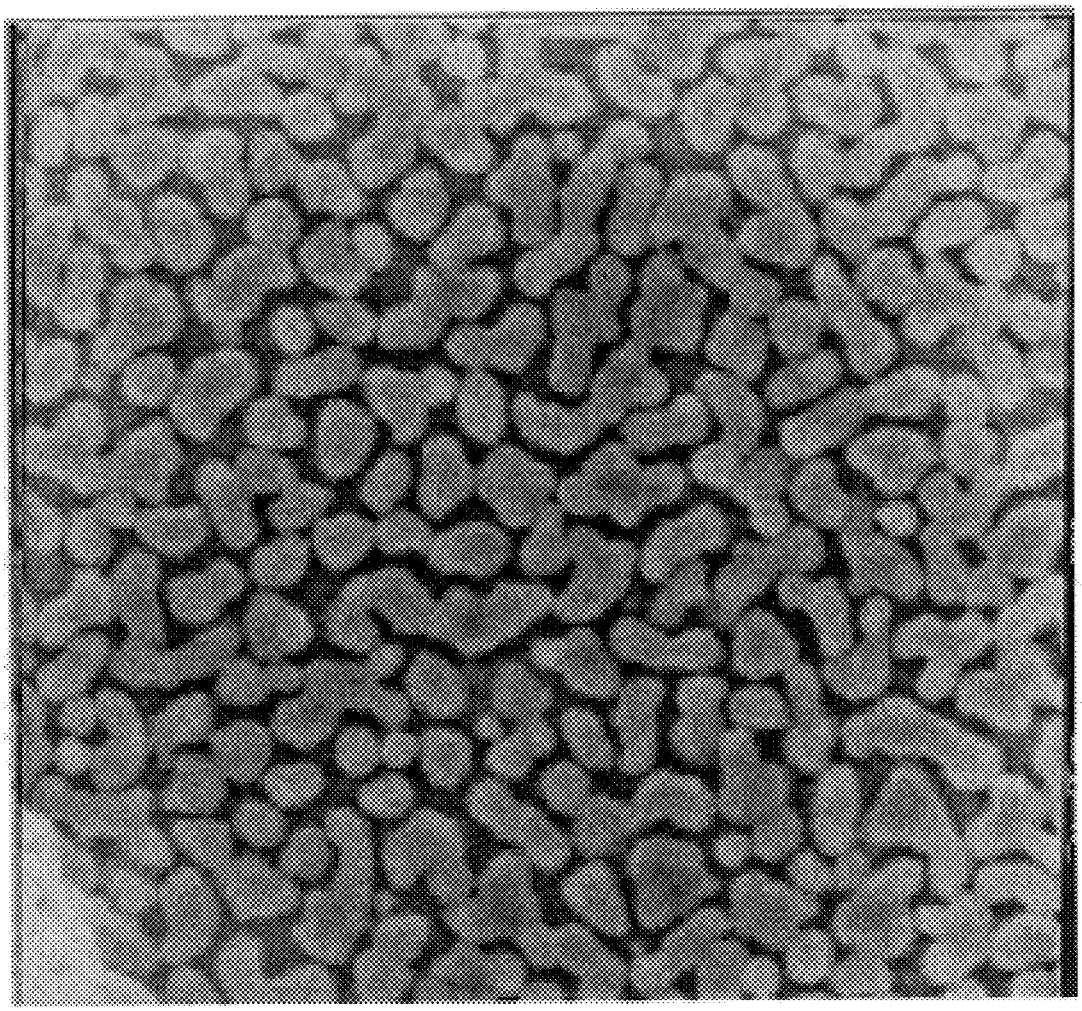
FIG. 10 is a SEM image of the state of the HSG film after charging up and cleaning the HSG film using the SC-1 cleaning solution according to an embodiment of the present invention.

FIG. 10 is a SEM image of the state of the HSG film 28 after charging up and cleaning the HSG film 28 using the SC-1 cleaning solution. As shown in FIG. 10, the state of the HSG film 28 after the cleaning is almost the same as before the cleaning. Therefore, according to the present invention, the decrease of the surface area of the capacitor due to the cleaning for the HSG film can be prevented, thereby contributing the increase of the capacitance of the capacitor. The surface state of the HSG film which is electron-charged up remains constant regardless of the cleaning time.

Figure 8:
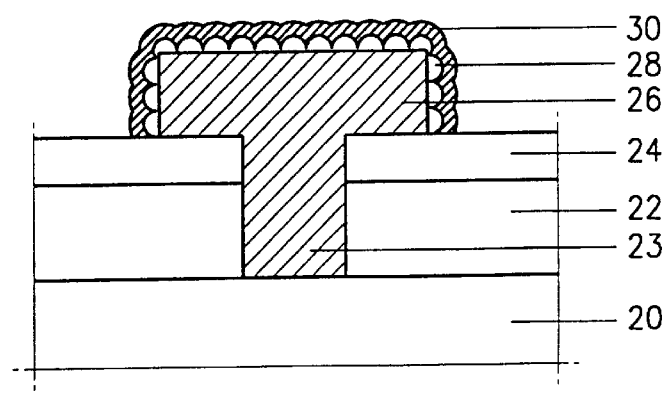

FIG. 8 is a cross-sectional view showing that the dielectric film 30 is deposited on the HSG film 28, wherein a nitride film is formed on the HSG film 28 by a typical CVD technique, and by dry or wet-oxidizing the surface of the nitride film, a nitride-oxide (NO) dielectric film 30 is formed.

Figure 9:
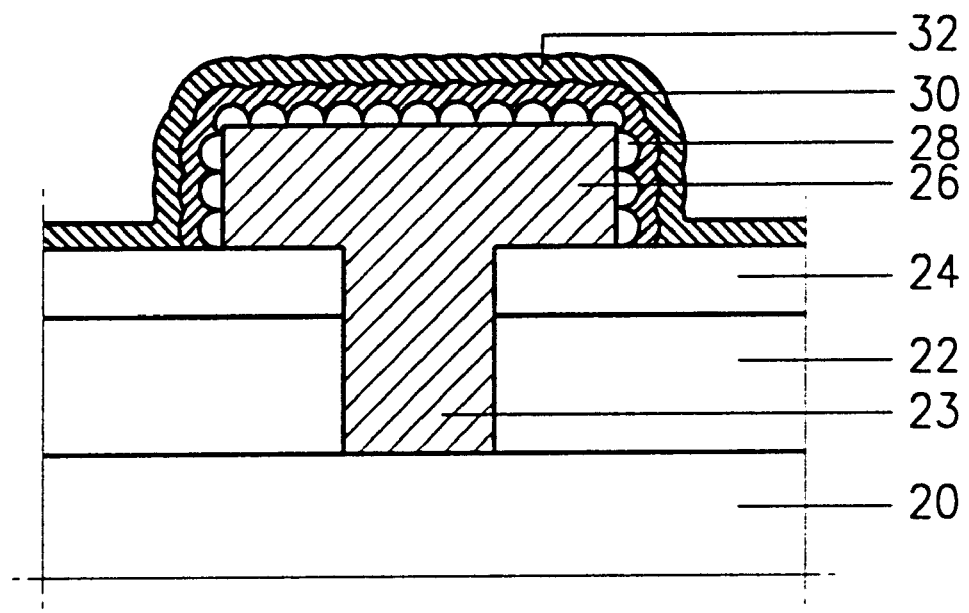

FIG. 9 is a cross-sectional view showing that a upper electrode 32 is deposited on the dielectric film. The upper electrode 32 may be formed by depositing doped-polysilicon layer on the NO dielectric film 30, thereby completing the formation of the capacitor.

Therefore, according to the present invention, the HSG film formed over the semiconductor substrate is stabilized before carrying out subsequent processing, e.g., cleaning, of the HSG film so that the HSG film is prevented from being worn down during the subsequent processing, thereby sufficiently maintaining a desired capacitance of the capacitor.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A method of manufacturing a capacitor of a semiconductor device comprising:
    forming a lower electrode of a capacitor of a semiconductor device over a specific structure formed on a semiconductor substrate;
    forming a hemispherical grained (HSG) film on an exposed surface of the lower electrode; and
    stabilizing the HSG film prior to subsequent processing to form a stabilized HSG film, said stabilizing comprising performing an electron charge-up on a surface of the HSG film for between 5 and 20 minutes.

2. The method as claimed in claim 1, wherein said performing of the electron charge-up includes using a scanning electron microscope (SEM).

3. The method as claimed in claim 2, wherein said using a scanning electron microscope includes setting an acceleration voltage of the scanning electron microscope between 1000 and 1500 V and a filament current of the scanning electron microscope between 8 and 12 A.

4. The method as claimed in claim 1, wherein said forming of a HSG film comprises using a Low Pressure Chemical Vapor Deposition (LPCVD).

5. The method as claimed in claim 1, further comprising cleaning the stabilized HSG film.

6. The method as claimed in claim 5, wherein said cleaning of the stabilized HSG film comprises using a Standard Chemical-1 (SC-1) cleaning solution.

* * * * *